(12) United States Patent
Chaudhary et al.

(10) Patent No.: US 7,075,333 B1
(45) Date of Patent: Jul. 11, 2006

(54) PROGRAMMABLE CIRCUIT OPTIONALLY CONFIGURABLE AS A LOOKUP TABLE OR A WIDE MULTIPLEXER

(75) Inventors: Kamal Chaudhary, San Jose, CA (US); Philip D. Costello, Saratoga, CA (US); Venu M. Kondapalli, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 58 days.

(21) Appl. No.: 10/925,259

(22) Filed: Aug. 24, 2004

(51) Int. Cl.
*H03K 19/173* (2006.01)
*H03K 19/177* (2006.01)
*H01L 25/00* (2006.01)
*G06F 7/38* (2006.01)

(52) U.S. Cl. .............................. 326/38; 326/39; 326/41
(58) Field of Classification Search .................. 326/38, 326/39, 41
See application file for complete search history.

(56) References Cited

U.S. PATENT DOCUMENTS

| | | | |
|---|---|---|---|
| 5,352,940 A | * | 10/1994 | Watson ........................ 326/44 |
| 5,889,413 A | | 3/1999 | Bauer |
| 6,292,019 B1 | | 9/2001 | New et al. |
| 6,556,042 B1 | | 4/2003 | Kaviani |
| 6,768,338 B1 | * | 7/2004 | Young et al. .................. 326/44 |
| 2005/0146352 A1 | * | 7/2005 | Madurawe .................... 326/41 |

* cited by examiner

*Primary Examiner*—Rexford Barnie
*Assistant Examiner*—Jason Crawford
(74) *Attorney, Agent, or Firm*—Lois D. Cartier

(57) ABSTRACT

Circuits that can be optionally programmed to function as lookup tables (LUTs) or wide multiplexers, and integrated circuits including these programmable circuits. A function select multiplexer is included between each memory cell and the corresponding data input terminal of a first multiplexer. Each function select multiplexer has a first data input terminal coupled to the corresponding memory cell, a second data input terminal coupled to an external input terminal, and a select terminal controlled by a value stored in a function select memory cell. When a first value is stored in the function select memory cell, the programmable circuit functions in the same fashion as a known LUT. When a second value is stored in the function select memory cell, the programmable circuit functions as a wide multiplexer, with the data input values being provided by the external input terminals.

22 Claims, 14 Drawing Sheets

PROGRAMMABLE CIRCUIT OPTIONALLY CONFIGURABLE AS A LOOKUP TABLE OR A WIDE MULTIPLEXER

FIELD OF THE INVENTION

The invention relates to integrated circuits including programmable lookup tables (LUTs). More particularly, the invention relates to a programmable circuit that can be optionally configured as either a lookup table or a wide multiplexer.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

FIG. 1 is a simplified illustration of an exemplary FPGA. The FPGA of FIG. 1 includes an array of configurable logic blocks (LBs 101a–101i) and programmable input/output blocks (I/Os 102a–102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups that implement multiplexer circuits selecting one of several interconnect lines to provide a signal to a destination interconnect line or logic block. For example, in FIG. 1 PIP group 105 forms an input multiplexer selecting one of several interconnect lines to provide an input signal to an input terminal of LB 101a. Some FPGAs also include additional logic blocks with special purposes (not shown), e.g., DLLs, RAM, and so forth.

FIG. 2 illustrates in simplified form a configurable logic element (CLE) for an FPGA. CLE 200 of FIG. 2 includes four similar slices SLICE_0–SLICE_3. Each slice includes two lookup tables (LUTs) 201 and 202, a write control circuit 205, three multiplexers MUX1, MUX2, and MF5_n, and two output memory elements 203 and 204. Each pair of slices also includes an additional multiplexer MF6_n, MF7_n, or MF8_n. Lookup tables 201 and 202, write control circuit 205, multiplexers MUX1 and MUX2, and output memory elements 203 and 204 are controlled by configuration memory cells M1–M7. Note that at least some of configuration memory cells M1–M7 represent more than one memory cell. Additional configuration memory cells and logic elements are omitted from FIG. 2, for clarity.

Each LUT 201, 202 can function in any of several modes. When in lookup table mode, each LUT has four data input signals IN1–IN4 that are supplied by the FPGA interconnect structure (see FIG. 1) via input multiplexers (e.g., see PIP group 105 in FIG. 1). When in RAM mode, input data is supplied by an input terminal RAM_DI_1, RAM_DI_2 to the DI terminal of the associated LUT. RAM write operations in both LUTs are controlled by write control circuit 205, which supplies one or more write control signals W to both LUTs based on RAM control signals provided by the interconnect structure. (In the present specification, the same reference characters are used to refer to terminals, signal lines, and their corresponding signals.)

Each LUT 201, 202 provides a LUT output signal to an associated multiplexer MUX1, MUX2, which selects between the LUT output signal and an associated register direct input signal Reg_DI_1, Reg_DI_2 from the interconnect structure. Thus, each LUT can be optionally bypassed. The output of each multiplexer MUX1, MUX2 is provided to the data input terminal D of an associated output memory element (203, 204 respectively). Memory elements 203 and 204 are clocked by a clock signal CK (e.g., provided by a global clock network) and controlled by various other register control signals (e.g., from the interconnect structure or provided by configuration memory cells of the FPGA). Each memory element 203, 204 provides a registered output signal Q1, Q2. The output of each LUT 201, 202 is also provided to an output terminal OUT1, OUT2 of the CLE. Thus, each output memory element can be optionally bypassed.

The LUT output signals can be multiplexed together to form some larger functions using the MF5–MF8 multiplexers. In each slice a corresponding multiplexer MF5_n is driven by the output signals from LUTs 201 and 202, and is controlled by an external input signal F5_Sel to provide output signal F5_n. Multiplexer MF6_n is provided only once for each pair of slices (e.g., in slices SLICE_0 and SLICE_2). Multiplexer MF6_n is driven by the F5_n output signals from the two associated slices, and is controlled by external input signal F6_Sel. Multiplexer MF7_1 is provided only in slice SLICE_1, and is driven by the F6_n output signals from slices SLICE_0 and SLICE_2. Therefore, multiplexer MF7_1 combines the output signals from all eight LUTs in CLE 200. Multiplexer MF7_1 is controlled by an external input signal F7_Sel (not shown). Multiplexer MF8_3 is provided only in slice SLICE_3, and is driven by the F7_1 output signal from the same CLE (CLE 200) and from an adjoining CLE (signal F7_1'). Therefore, multiplexer MF8_3 can be used to combine the output signals from all sixteen LUTs in two adjoining CLEs.

FIG. 3 illustrates in simplified form a well known 4-input lookup table (LUT) for a PLD. The lookup table is implemented as a four-stage 16-to-1 multiplexer. The four input signals A1–A4 together select one of 16 values stored in memory cells MC-0 through MC-15. Thus, the lookup table can implement any function of up to four input signals.

The four input signals A1–A4 are independent signals, each driving one stage of the multiplexer. Inverted versions A1B–A4B of signals A1–A4 are generated by inverters 301–304, respectively. Sixteen configuration memory cells MC-0 through MC-15 drive sixteen corresponding CMOS pass gates 330–345. In a first stage of the multiplexer, paired pass gates 330–331 form a 2-to-1 multiplexer controlled by signals A1 and A1B, which multiplexer drives a CMOS pass gate 346. Pass gates 332–345 are also paired in a similar fashion to form similar 2-to-1 multiplexers driving associated pass gates 347–353. In a second stage of the multiplexer, paired pass gates 346–347 form a 2-to-1 multiplexer controlled by signals A2 and A2B, which multiplexer drives an inverter 305. Similarly, pass gates 348–353 are paired to form similar 2-to-1 multiplexers driving associated inverters 306–308.

In a third stage of the multiplexer, driven by inverters 305–308, pass gates 354–355 are paired to form a 2-to-1 multiplexer controlled by signals A3 and A3B and driving a CMOS pass gate 358. Similarly, pass gates 356–357 are paired to form a similar 2-to-1 multiplexer driving a CMOS pass gate 359. In a fourth stage of the multiplexer, pass gates 358–359 are paired to form a 2-to-1 multiplexer controlled by signals A4 and A4B and driving an inverter 309. Inverter 309 provides the LUT output signal OUT.

FIG. 4 illustrates another known 4-input LUT. The LUT of FIG. 4 is similar to that of FIG. 3, except that N-channel transistors 430–459 are substituted for CMOS pass gates 330–359. Because an N-channel transistor imposes a voltage drop on power high signals traversing the transistor, the node driving each inverter 305–309 is also enhanced by the addition of a pullup (e.g., a P-channel transistor) 460–464 to power high VDD. Each pullup 460–464 is gated by the output of the corresponding inverter 305–309. The pullup ensures that a high value on the node driving the inverter is pulled all the way to the power high value once a low value appears on the inverter output node.

Wide multiplexers are frequently included in PLD designs, e.g., in digital signal processing (DSP) applications. There are various methods of implementing wide multiplexers, but one common method utilizes the existing LUTs, e.g., the LUTs shown in FIGS. 2–4. The implementation of an N-to-1 multiplexer (MUX) requires N input terminals for the N data inputs and log(2) N (the logarithm of N to the base 2) select input terminals. For example, a 2-to-1 multiplexer requires two data input terminals and 1 select terminal, a 4-to-1 multiplexer requires 4 data input terminals and 2 select terminals, and so forth. Table 1 shows the number of input terminals required to implement some variously-sized multiplexers.

TABLE 1

| Size of MUX | #Data inputs | #Select inputs | Total inputs |
|---|---|---|---|
| 2-to-1 | 2 | 1 | 3 |
| 4-to-1 | 4 | 2 | 6 |
| 8-to-1 | 8 | 3 | 11 |
| 16-to-1 | 16 | 4 | 20 |
| 32-to-1 | 32 | 5 | 37 |
| 64-to-1 | 64 | 6 | 70 |

The largest multiplexer that can be implemented in one of the LUTs of FIGS. 3 and 4 is a 2-to-1 multiplexer, because each LUT can provide any function of up to four inputs. In the CLE of FIG. 2, each of LUTs 201, 202 can implement a 2-to-1 multiplexer; each MUXF5 multiplexer can be used with two LUTs to implement a 4-to-1 multiplexer; and each MUXF6 multiplexer can be used with two MUXF5 multiplexers and four LUTs to implement an 8-to-1 multiplexer. To implement a 16-to-1 multiplexer in the CLE of FIG. 2 requires one MUXF7 multiplexer, two MUXF6 multiplexers, four MUXF5 multiplexers, and eight LUTs (i.e., all of the LUTs in the CLE). Additionally, each path delay through the 16-to-1 multiplexer includes the delay of one LUT, three multiplexers, and the interconnect paths between these elements.

Therefore, it is desirable to provide LUTs that can more efficiently and/or rapidly perform wide multiplexing functions in PLDs.

SUMMARY OF THE INVENTION

The invention provides circuits that can be optionally programmed to function as lookup tables (LUTs) or wide multiplexers. A function select multiplexer is included between each memory cell and the corresponding data input terminal of a first multiplexer. Each function select multiplexer has a first data input terminal coupled to the corresponding memory cell, a second data input terminal coupled to an external input terminal, and a select terminal controlled by a value stored in a function select memory cell. When a first value is stored in the function select memory cell, the programmable circuit functions in the same fashion as a known LUT. If the LUT is further configurable as a shift register or a random access memory (RAM), as in some known programmable logic devices (PLDs), these functions are also available. When a second value is stored in the function select memory cell, the programmable circuit functions as a wide multiplexer, with the data input values being provided by the external input terminals.

The invention also provides integrated circuits that include programmable circuits such as those described in the previous paragraph. For example, an integrated circuit is provided that includes an interconnect structure and a plurality of programmable circuits such as those described above. In some embodiments, the integrated circuit is a programmable logic device (PLD). When the integrated circuit is a field programmable gate array (FPGA), for example, the memory cells can be configuration memory cells of the FPGA. Some embodiments include input multiplexers coupled between the interconnect structure and the programmable circuits, and/or output multiplexers coupled between the programmable circuits and the interconnect structure.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 3:
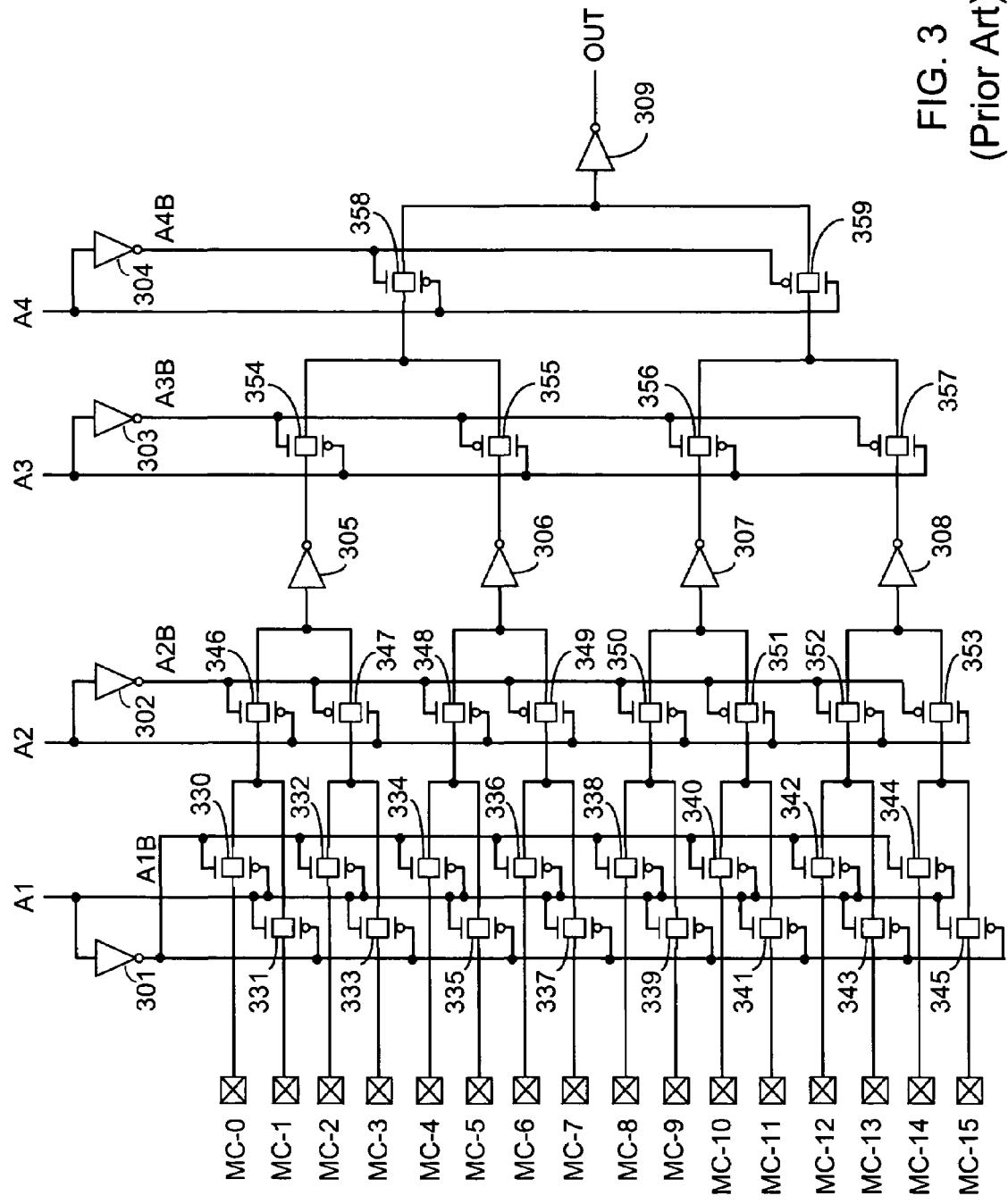
FIG. 3 illustrates in simplified form a well known 4-input lookup table (LUT) for a PLD.
Figure 5:
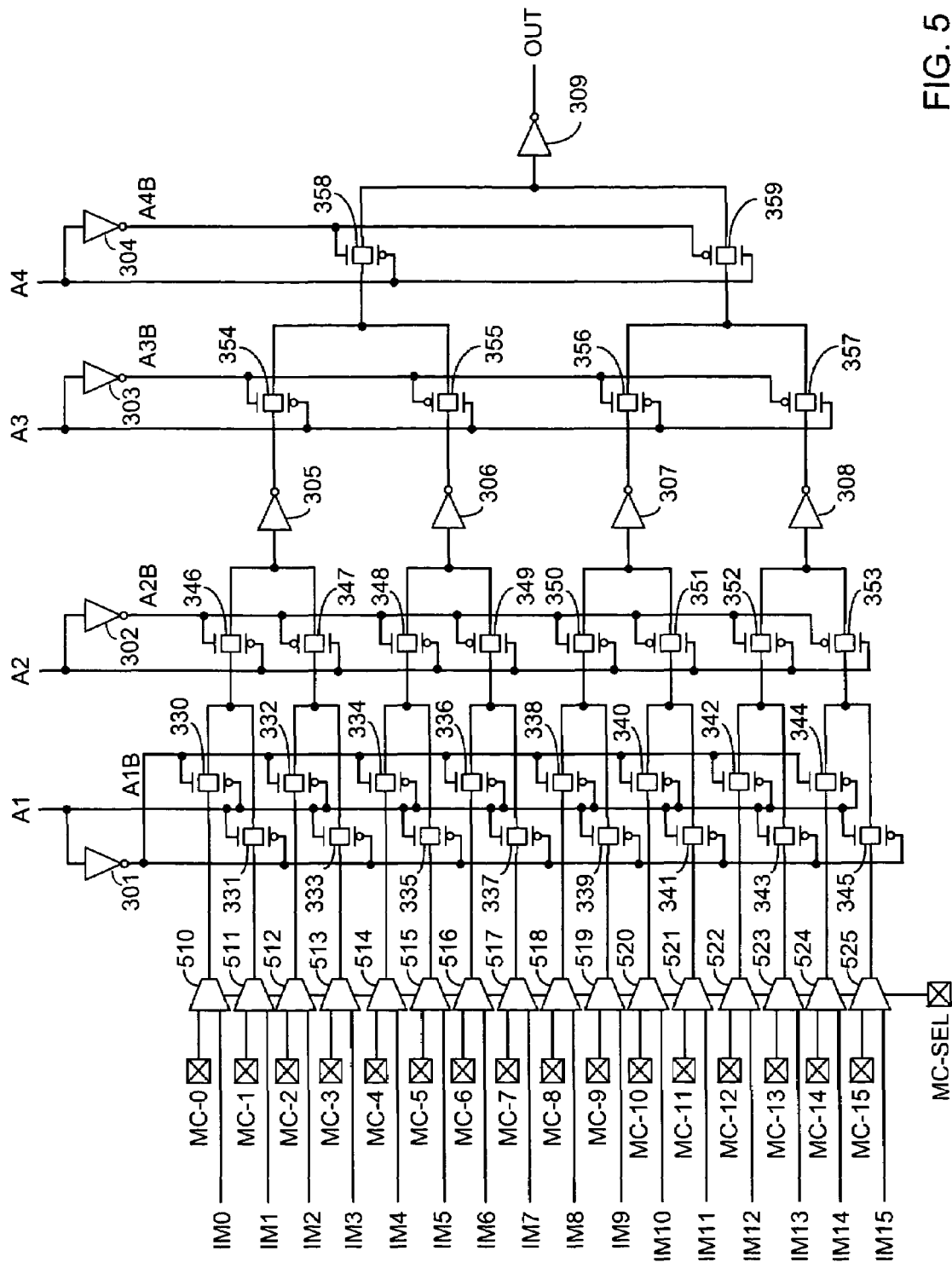
FIG. 5 illustrates a first programmable circuit configurable as either a 4-input LUT or a 16-to-1 multiplexer.

FIG. 5 illustrates a first programmable circuit configurable as either a 4-input LUT or a 16-to-1 multiplexer. The circuit of FIG. 5 is similar to that of FIG. 3, with similar elements being similarly numbered. However, the circuit of FIG. 5 includes a function select multiplexer 510–525 coupled between each memory cell MC-0 through MC-15 and the corresponding CMOS pass gate 330–345. Each function select multiplexer 510–525 has a first data input terminal coupled to the corresponding memory cell MC-0 through MC-15, a second data input terminal coupled to an external input terminal IM0–IM15, and a select terminal coupled to function select memory cell MC-SEL.

When a first value is stored in function select memory cell MC-SEL, the programmable circuit functions in the same fashion as a known LUT, i.e., the value stored in memory cell MC-0 through MC-15 is passed to the associated CMOS pass gate 330–345. If the LUT is further configurable as a shift register or a random access memory (RAM), as in some known PLDs, these functions are also available. Logic circuitry for these functions is omitted from FIG. 5, for clarity. However, Bauer describes an exemplary LUT having this capability in U.S. Pat. No. 5,889,413 entitled "Lookup Tables Which Double as Shift Registers", which document is hereby incorporated herein by reference. When a second value is stored in function select memory cell MC-SEL, the programmable circuit of FIG. 5 functions as a wide multiplexer, with the data input values being provided by the external input terminals IM0–IM15.

In the embodiment of FIG. 5, as in the other embodiments pictured herein, the selection between the two functions (LUT and wide multiplexer) for the programmable circuit is made based on a single value stored in a single memory cell. However, as will be clear to those of skill in the relevant art, more than one memory cell can be used to make the selection, if desired, or a single memory cell can be used to select a function for more than one of the programmable circuits.

Figure 1:
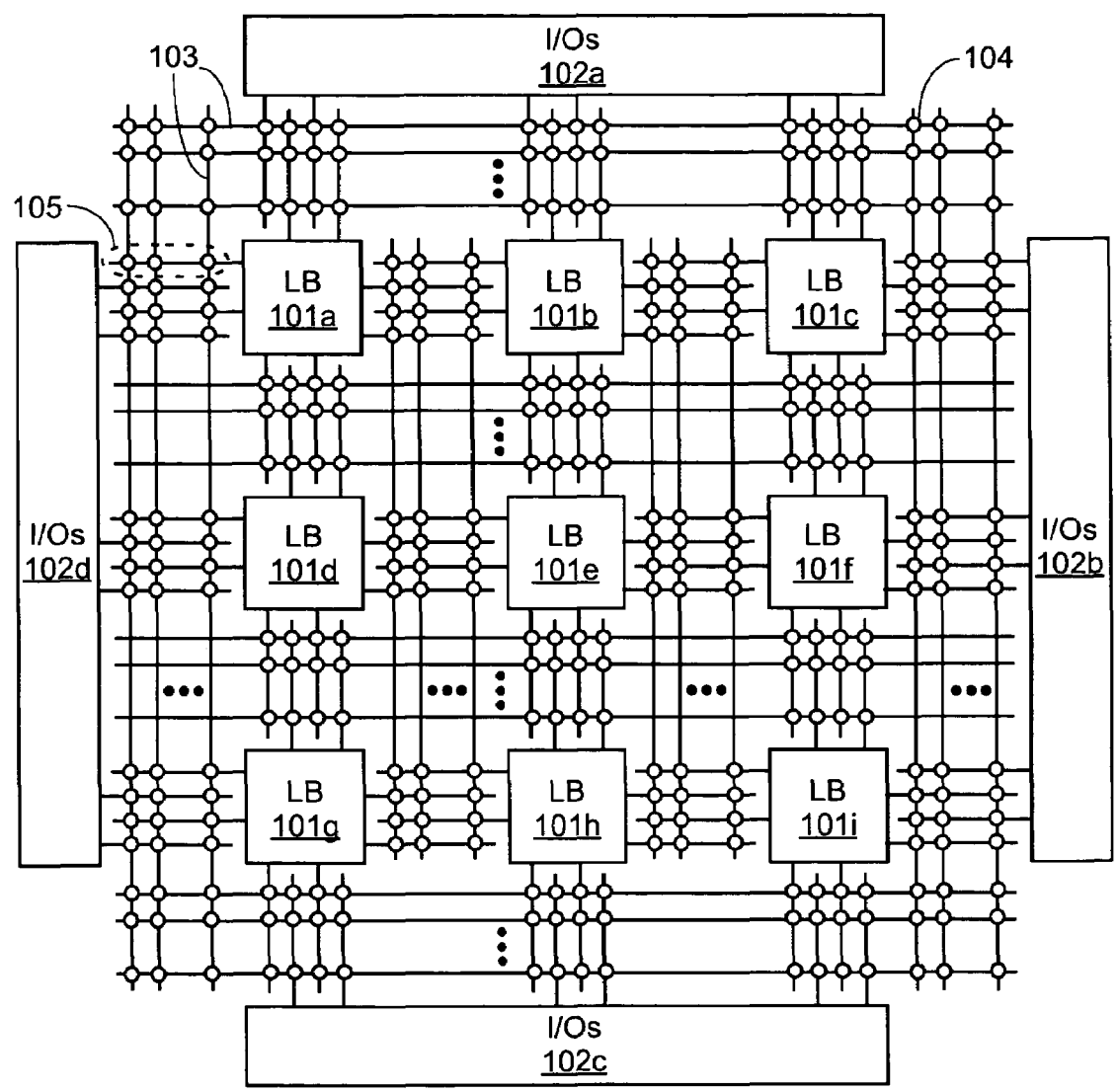
FIG. 1 is a simplified illustration of a well known field programmable gate array (FPGA).
Figure 2:
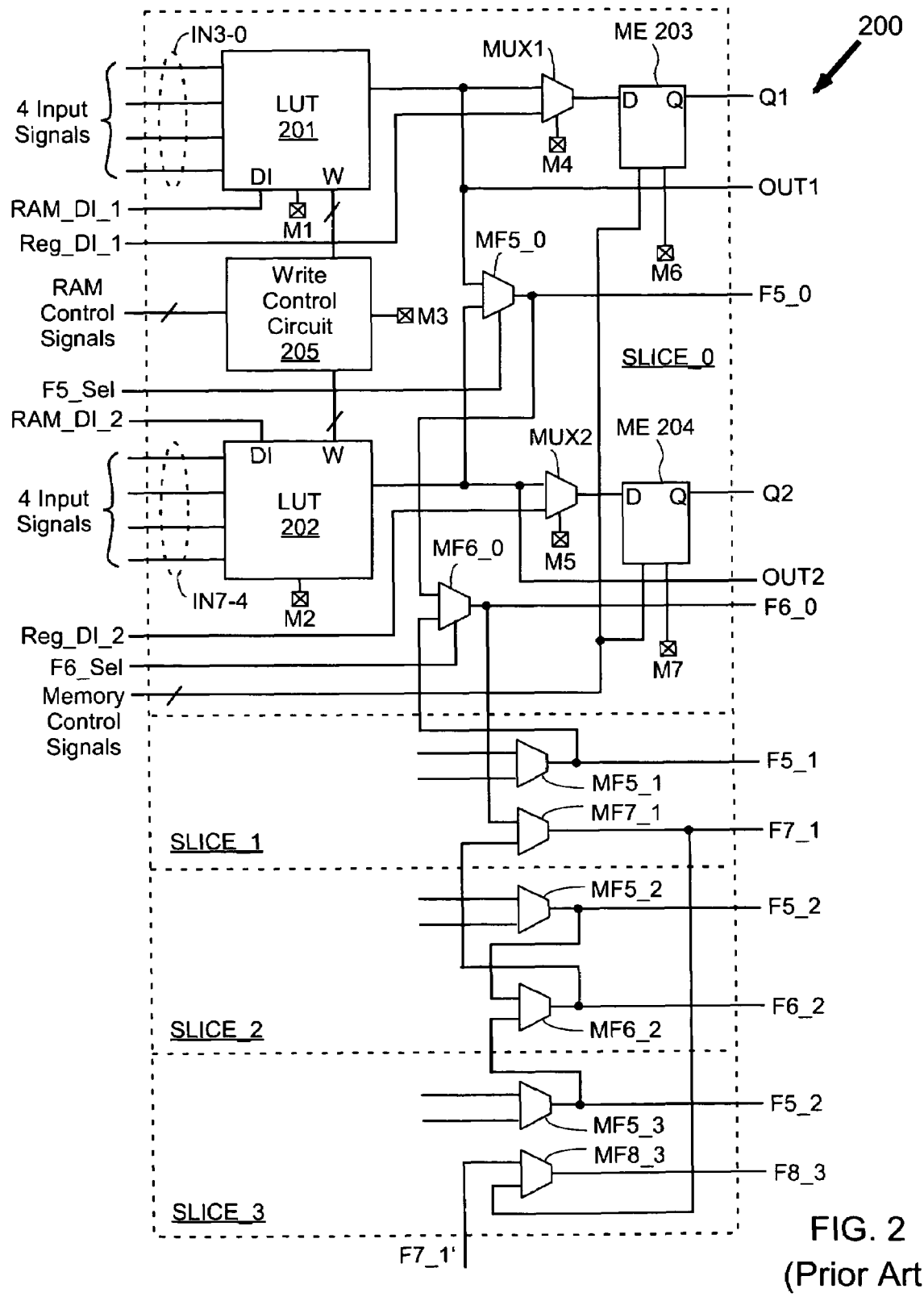
FIG. 2 illustrates in simplified form a configurable logic element (CLE) for an FPGA.

In one embodiment, the circuit of FIG. 5 is included in the configurable logic element (CLE) of FIG. 2, replacing LUTs 201 and 202. In other embodiments, the circuit is used in other CLEs, or in other PLDs not having CLEs, or in integrated circuits that are only partially programmable. It will be apparent to one skilled in the art after reading this specification that the present invention can be practiced within these and other architectural variations.

Figure 4:
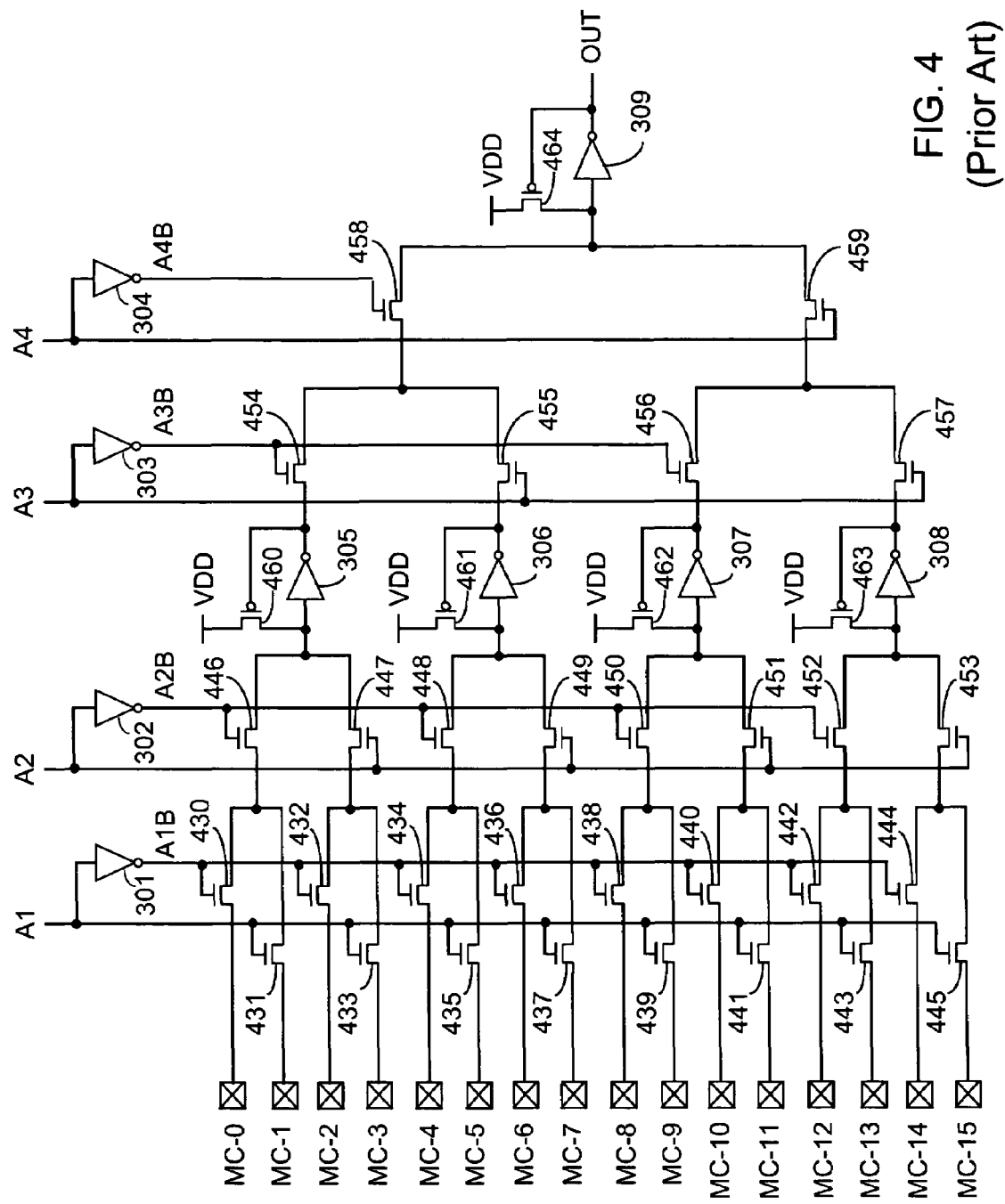
FIG. 4 illustrates another well known 4-input LUT.
Figure 6:
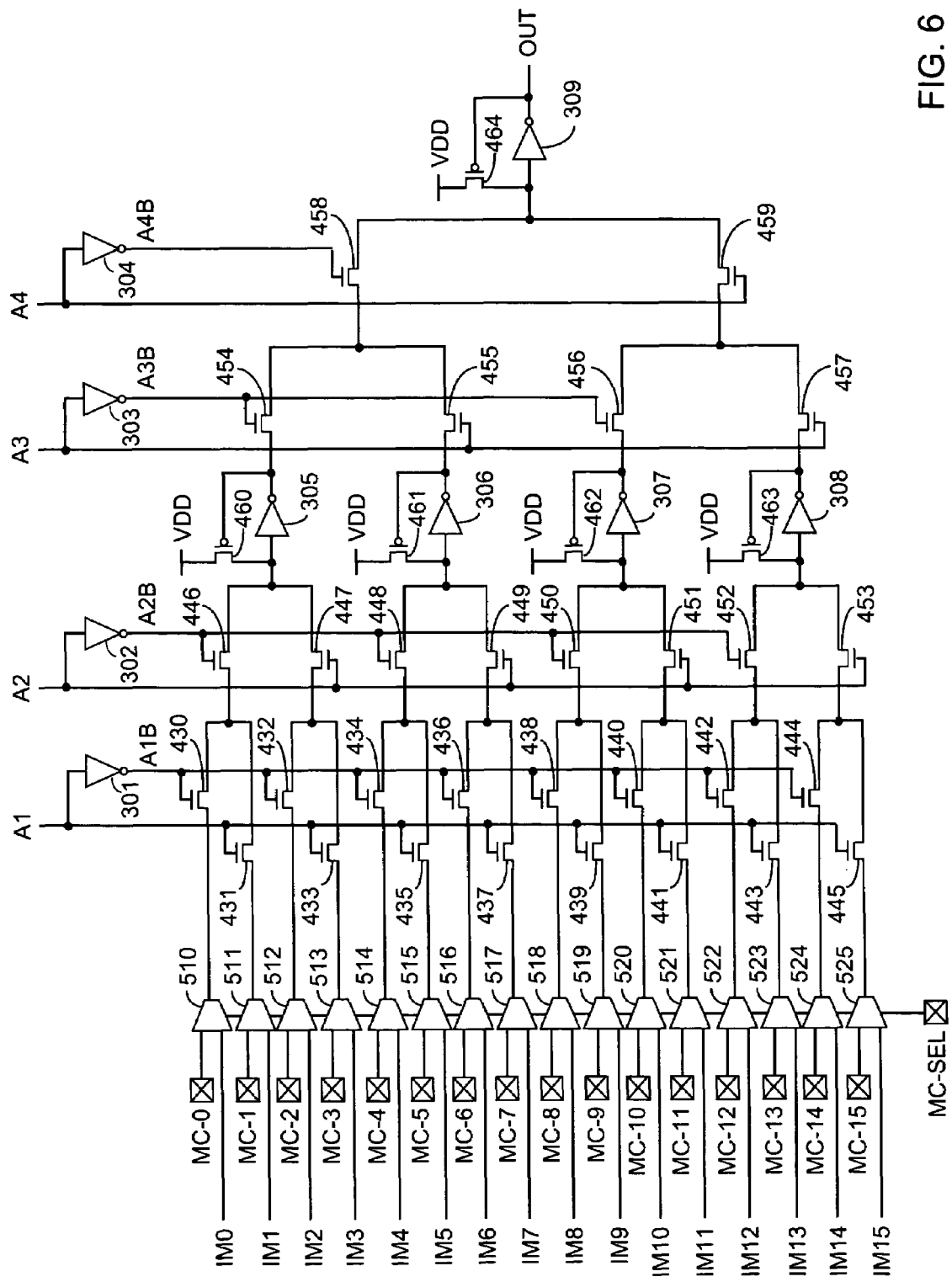
FIG. 6 illustrates a second programmable circuit configurable as either a 4-input LUT or a 16-to-1 multiplexer.

FIG. 6 illustrates a second programmable circuit configurable as either a 4-input LUT or a 16-to-1 multiplexer. The circuit of FIG. 6 is similar to that of FIG. 4, with similar elements being similarly numbered. However, the circuit of FIG. 6 includes a function select multiplexer 510–525 coupled between each memory cell MC-0 through MC-15 and the corresponding N-channel transistor 430–445. Each function select multiplexer 510–525 has a first data input terminal coupled to the corresponding memory cell MC-0 through MC-15, a second data input terminal coupled to an external input terminal IM0–IM15, and a select terminal coupled to function select memory cell MC-SEL. The circuit of FIG. 6 functions in a similar manner to the circuit of FIG. 5.

Figure 7:
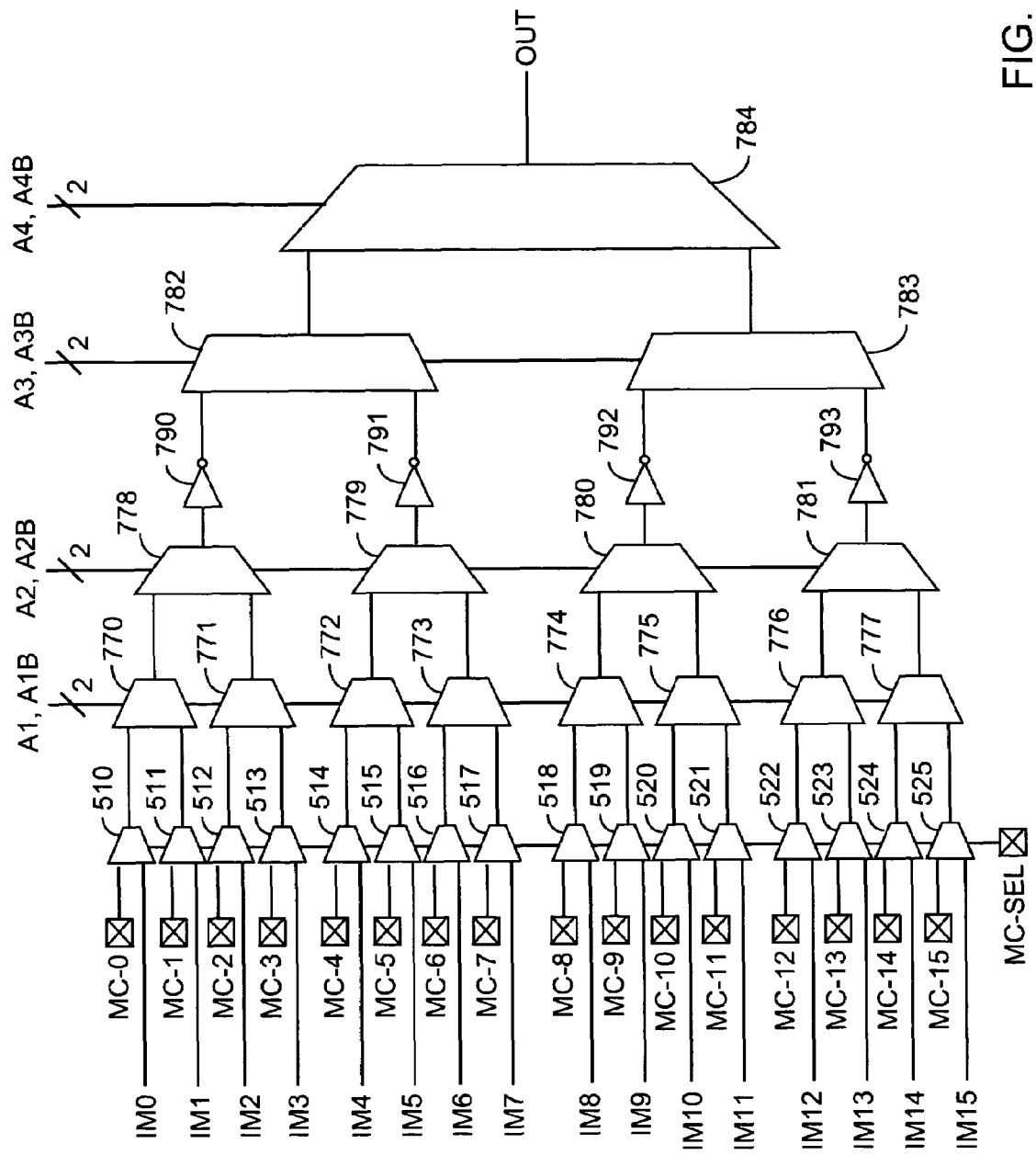
FIG. 7 is a more general diagram showing a 4-input programmable LUT/16-to-1 multiplexer circuit that can be implemented, for example, as shown in FIGS. 5 and 6.

FIG. 7 is a more general diagram showing a 4-input programmable LUT/16-to-1 multiplexer circuit that can be implemented, for example, as shown in FIGS. 5 and 6. The programmable circuit of FIG. 7 includes four different multiplexer stages, each driven by a different independent input signal A1–A4 and their complementary values A1B–A4B.

Sixteen configuration memory cells MC-0 through MC-15 drive sixteen function select multiplexers 510–525 controlled by a value stored in memory cell MC-SEL. Each function select multiplexer has an additional input IM0–IM15 supplied by an external source (e.g., an interconnect structure). Each pair of function select multiplexers 510–525 drives a corresponding 2-to-1 multiplexer 770–777. Multiplexers 770–777 together form the first stage of the multiplexer circuit, which is controlled by first input signals A1, A1B. Multiplexers 770–777 can be implemented, for example, using CMOS pass gates or N-channel transistors as illustrated in FIGS. 5 and 6, respectively. Multiplexers 770–777 are paired to drive four 2-to-1 multiplexers 778–781. Multiplexers 778–781 together form the second stage of the multiplexer circuit, which is controlled by second input signals A2, A2B. Multiplexers 778–781 can be implemented, for example, using CMOS pass gates or N-channel transistors as illustrated in FIGS. 5 and 6, respectively.

In the pictured embodiment, multiplexer 778 drives buffer 790. Multiplexer 779 drives buffer 791, multiplexer 780 drives buffer 792, and multiplexer 781 drives buffer 793. Buffers 790–793 can optionally include a pullup (not shown in FIG. 7), as shown in FIG. 6, for example.

In the third stage of the multiplexer, buffers 790–793 are paired to drive two 2-to-1 multiplexers 782–783. Multiplexers 782–783 are controlled by third input signals A3, A3B. Multiplexers 782–783 can be implemented, for example, using CMOS pass gates or N-channel transistors as illustrated in FIGS. 5 and 6, respectively. Multiplexers 782–783 drive multiplexer 784, which forms the fourth stage of the multiplexer circuit and is controlled by fourth input signals A4, A4B. Multiplexer 784 can be implemented, for example, using CMOS pass gates or N-channel transistors as illustrated in FIGS. 5 and 6, respectively. Multiplexer 784 provides output signal OUT.

Note that the programmable circuits of FIGS. 5–7 provide for faster 16-to-1 multiplexer circuits. A 16-to-1 multiplexer implemented using a single LUT as shown has a path delay of only one multiplexer (one of the function select multiplexers) and one LUT, as opposed to one LUT and three multiplexers, plus interconnections, when known implementations are used.

Additionally, note that the programmable circuits of FIGS. 5–7 allow for the implementation of 16-to-1 multiplexers using a smaller amount of logic than when known LUTs are used. As previously described, a known implementation of a 16-to-1 multiplexer requires eight LUTs and seven additional 2-to-1 multiplexers (e.g., four MF5 multiplexers, two MF6 multiplexers, and one MF7 multiplexer, see FIG. 2). When any of the circuits of FIGS. 5–7 is used, only one LUT is needed to implement the same function, with sixteen 2-to-1 function select multiplexers. Because a typical LUT includes fifteen 2-to-1 multiplexers (see FIGS. 3–4), the embodiments of FIGS. 5–7 make more efficient use of the available resources when wide multiplexers are included in the design. Most designs that use wide multiplexers also require LUTs. Therefore, in some embodiments only some of the LUTs are replaced by programmable circuits such as those described herein.

Figure 8:
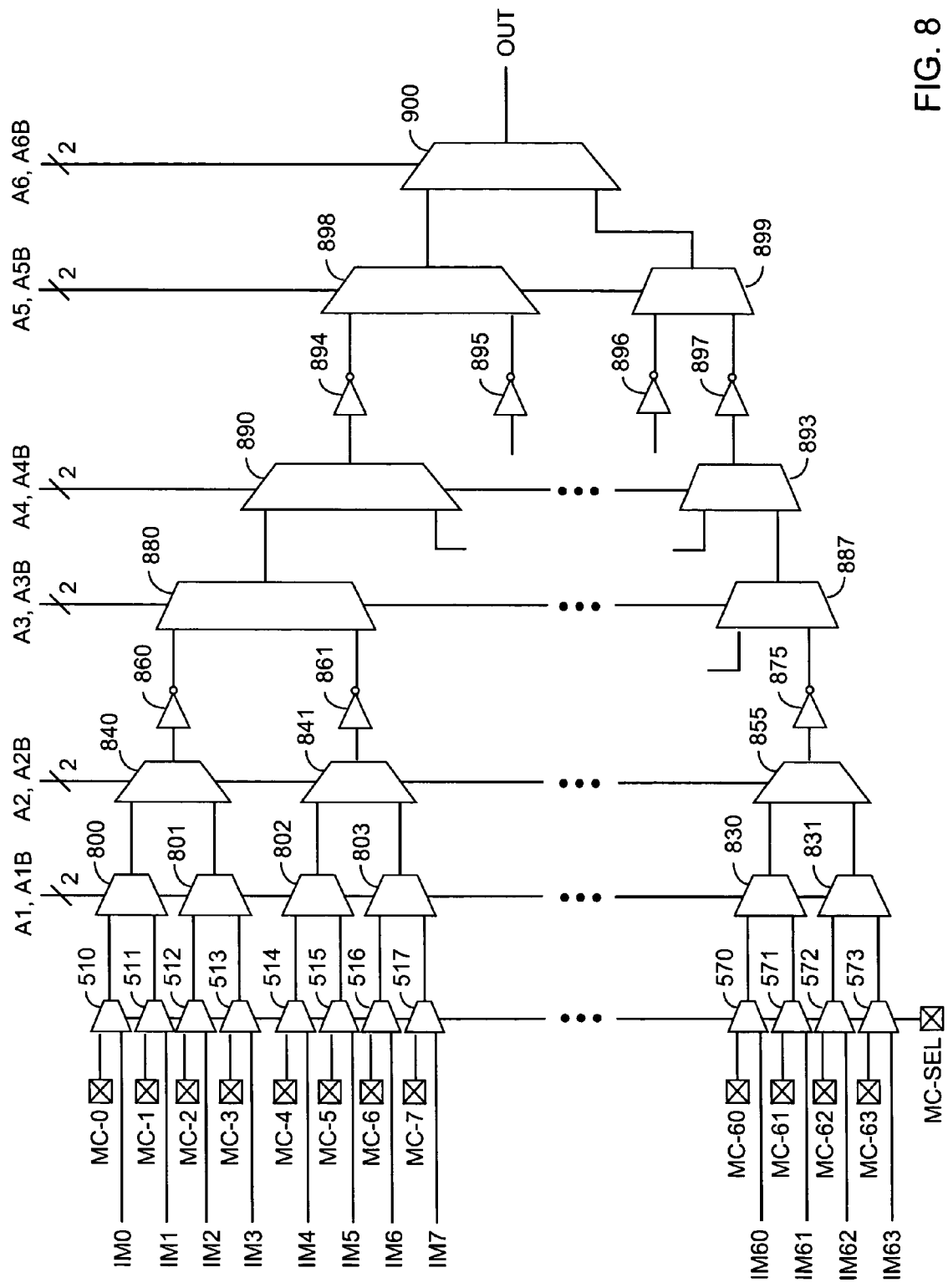
FIG. 8 provides an example of how the principles of the present invention can be applied to LUTs having more than four inputs.

FIG. 8 provides an example of how the principles of the present invention can be applied to LUTs having more than four inputs. The programmable circuit of FIG. 8 includes six different multiplexer stages, each driven by a different independent input signal A1–A6 and their complementary values A1B–A6B. Programmable circuits having numbers of input signals other than four or six (e.g., three, five, seven, eight, and so forth) can also be implemented using the techniques described and illustrated herein. The illustrated embodiments are purely exemplary.

Sixty-four configuration memory cells MC-0 through MC-63 drive sixty-four corresponding function select multiplexers 510–573 controlled by a value stored in memory cell MC-SEL. Each function select multiplexer has an additional input IM0–IM63 supplied by an external source (e.g., an interconnect structure). Each pair of function select multiplexers 510–573 drives a corresponding 2-to-1 multiplexer 800–831. Multiplexers 800–831 together form the first stage of the multiplexer circuit, which is controlled by first input signals A1, A1B. Multiplexers 800–831 can be implemented, for example, using CMOS pass gates or N-channel transistors as illustrated in FIGS. 5 and 6, respectively. Multiplexers 800–831 are paired to drive sixteen 2-to-1 multiplexers 840–855. Multiplexers 840–855 together form the second stage of the multiplexer circuit, which is controlled by second input signals A2, A2B. Multiplexers 840–855 can be implemented, for example, using CMOS pass gates or N-channel transistors as illustrated in FIGS. 5 and 6, respectively.

In the pictured embodiment, multiplexer 840 drives buffer 860. Multiplexer 841 drives buffer 861, and the other multiplexers in the second stage drive corresponding buffers, including multiplexer 855 which drives buffer 875. Buffers 860–875 can optionally include a pullup (not shown in FIG. 8), as shown in FIG. 6, for example.

In the third stage of the multiplexer, buffers 860–875 are paired to drive eight 2-to-1 multiplexers 880–887. Multiplexers 880–887 are controlled by third input signals A3, A3B. Multiplexers 880–887 can be implemented, for example, using CMOS pass gates or N-channel transistors as illustrated in FIGS. 5 and 6, respectively. Multiplexers 880–887 are paired to drive four 2-to-1 multiplexers 890–893. Multiplexers 890–893 together form the fourth stage of the multiplexer circuit, which is controlled by fourth input signals A4, A4B. Multiplexers 890–893 can be implemented, for example, using CMOS pass gates or N-channel transistors as illustrated in FIGS. 5 and 6, respectively.

In the pictured embodiment, multiplexer 890 drives buffer 894. Additional multiplexers (not shown) in the fourth stage drive corresponding buffers 895–896, and multiplexer 893 drives buffer 897. Buffers 894–897 can optionally include a pullup (not shown in FIG. 8), as shown in FIG. 6, for example.

In the fifth stage of the multiplexer, buffers 894–897 are paired to drive 2-to-1 multiplexers 898–899. Multiplexers 898–899 are controlled by fifth input signals A5, A5. Multiplexers 898–899 can be implemented, for example, using CMOS pass gates or N-channel transistors as illustrated in FIGS. 5 and 6, respectively. Multiplexers 898–899 are paired to drive 2-to-1 multiplexer 900. Multiplexer 900 forms the sixth stage of the multiplexer circuit, which is controlled by sixth input signals A6, A6B. Multiplexer 900 can be implemented, for example, using CMOS pass gates or N-channel transistors as illustrated in FIGS. 5 and 6, respectively. Multiplexer 900 provides output signal OUT.

Note that the programmable circuit of FIG. 8 allows for the implementation of a 64-to-1 multiplexer using a single LUT and sixty-four 2-to-1 function select multiplexers, if a sufficiently large number of input signals are available to provide the necessary interconnections. However, in some embodiments fewer input signals are available (e.g., from an input multiplexer) than can be accommodated by the programmable circuit. In some of these embodiments, a subset of the memory cells feed directly into the multiplexer, while another subset pass through a function select multiplexer as shown in FIGS. 5–8. For example, half of the memory cells can feed directly into the multiplexer (e.g., 8 of 16, or 32 of 64), while the other half of the memory cells pass through a function select multiplexer. In other embodiments, other proportions are used.

Figure 9:
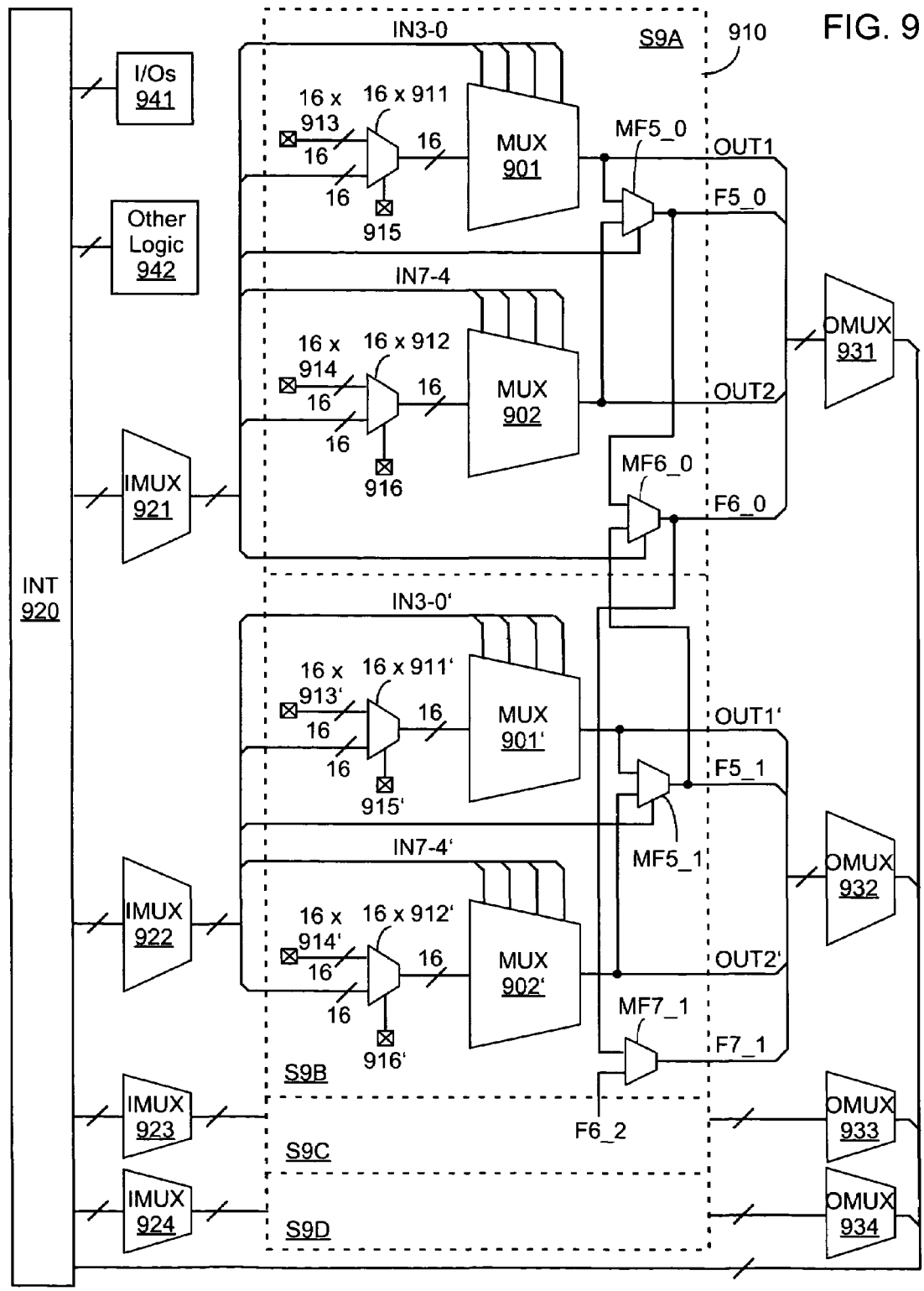
FIG. 9 illustrates a first exemplary fashion in which the programmable circuits of FIGS. 5–7 can be integrated into the fabric of an integrated circuit.

FIG. 9 illustrates a first exemplary fashion in which the programmable circuits of FIGS. 5–7 can be integrated into the fabric of an integrated circuit. Similar methods can be used in integrate differently-sized programmable circuits such as that of FIG. 8.

The integrated circuit (IC) of FIG. 9 is at least partially programmable. The IC of FIG. 9 includes a configurable logic element (CLE) 910, an interconnect structure (INT) 920, input/output circuitry (I/Os) 941, and optional other logic 942. In some embodiments, interconnect structure 920 is a programmable interconnect structure such as those commonly found in PLDs. In other embodiments, interconnect structure 920 is not programmable. In yet other embodiments, some portions of interconnect structure are programmable, and other portions of interconnect structure 920 are not programmable. The input/output circuitry 941 and other logic 942 can include additional programmable logic (for example, other logic 942 can include other instances of CLE 910), partially programmable logic, and/or non-programmable logic. Input multiplexers (IMUX) 921–924 are coupled between interconnect structure 920 and input terminals of CLE 910. Output multiplexers (OMUX) 931–934 are coupled between output terminals of CLE 910 and interconnect structure 920. CLE 910 includes four slices S9A–S9D.

CLE 910 is similar to CLE 200 of FIG. 2. Similar elements are similarly labeled, and these elements are not again described. Some elements shown in FIG. 2 are omitted from FIG. 9, for clarity. LUTs 201, 202 of FIG. 2 are replaced by programmable circuits that include: function select multiplexers 911, 912; memory cells 913, 914; function select memory cells 915, 916; and 16-to-1 multiplexers 901, 902. These programmable circuits can be implemented, for example, as shown in FIGS. 5–7.

Note that recurring instances of some similar elements in different slices in the figures herein are designated using apostrophe markings after the element numbers. For example, the labels 901, 901', 901", and 901'" denote similar elements occurring in four different slices.

As described above, all four slices of CLE 200 of FIG. 2 are required to implement a 16-to-1 multiplexer. By comparison, if a sufficiently large number of input signals are made available to each slice S9A–S9D, CLE 910 of FIG. 9 can be used to implement a 128-to-1 multiplexer (eight 16-to-1 multiplexers in each MUX 901, 902; four 32-to-1 multiplexers by adding the MF5 multiplexers; two 64-to-1 multiplexers by adding the MF6 multiplexers; and one 128-to-1 multiplexer by adding the MF7 multiplexer). However, few designs would benefit from the ability to implement a 128-to-1 multiplexer. Therefore, in some embodiments only a subset of the LUTs are replaced by programmable circuits such as those described herein.

Figure 10:
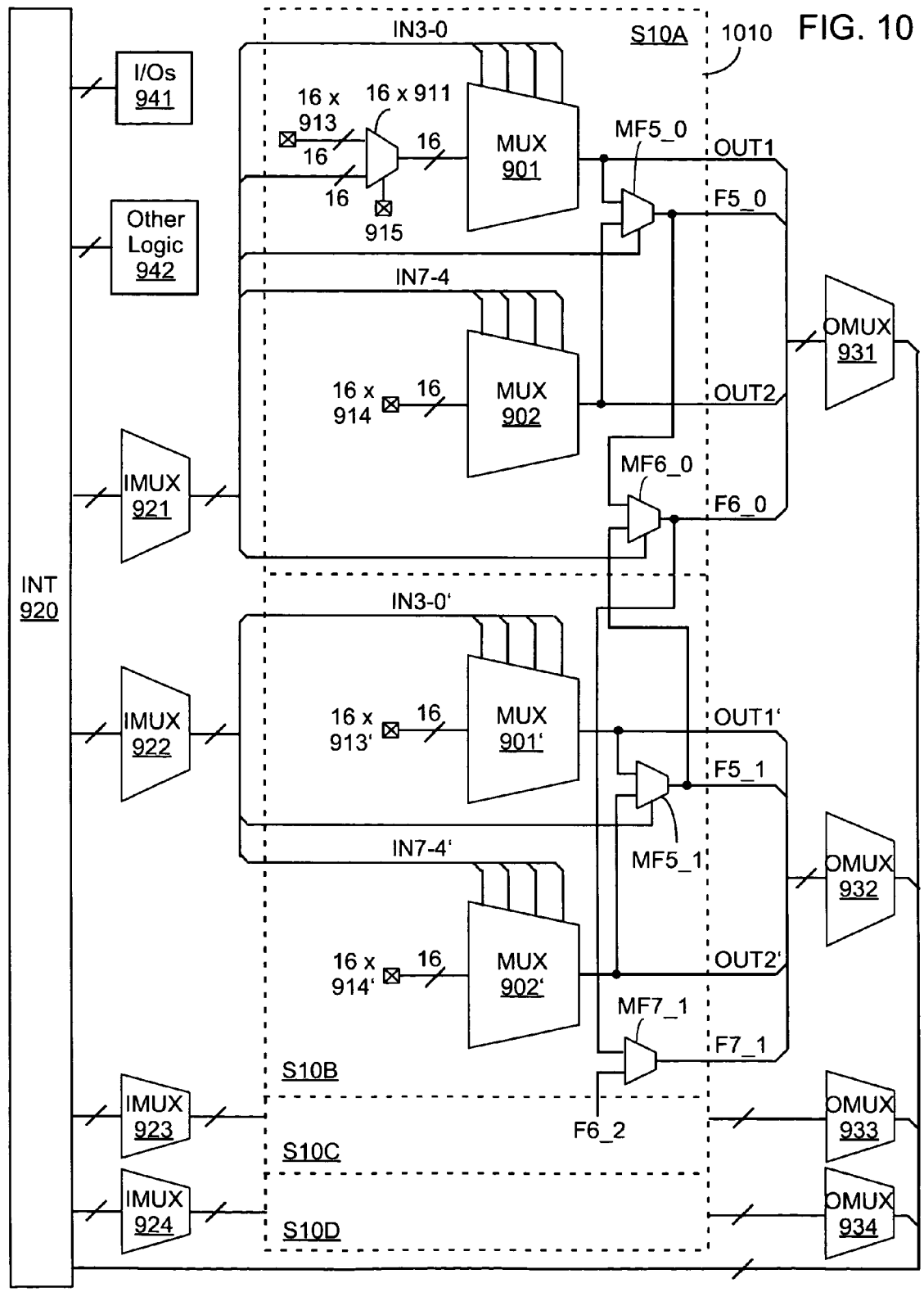
FIG. 10 illustrates a second exemplary fashion in which the programmable circuits of FIGS. 5–7 can be integrated into the fabric of an integrated circuit.

FIG. 10 illustrates a CLE 1010 in which one slice S10A includes one programmable circuit similar to those utilized in CLE 910 of FIG. 9 (elements 901, 911, 913, and 915), and one known LUT (elements 902 and 914). However, the other three slices S10B–S10D each include two known LUTs. Thus, only one eighth of the available lookup table circuits include the LUT/MUX programmable circuit. In other embodiments, other ratios are used, e.g., two or four of the illustrated programmable circuits are provided within each CLE. In other embodiments, the CLEs include other numbers of slices, LUTs, and/or programmable circuits.

In some embodiments, the LUT/MUX capability provided by the present invention can render additional multiplexing capabilities superfluous, or can reduce their usefulness to the point where they are no longer worth the area required to implement them. Thus, for example, in some embodiments similar to those of FIGS. 9 and 10 the MF5, MF6, MF7, and MF8 multiplexers are omitted.

FIGS. 9 and 10 each illustrate a CLE including at least one programmable circuit that can optionally implement a 16-to-1 multiplexer using a single 4-input LUT and sixteen function select multiplexers. However, to implement this function requires 20 input signals, and this large number of input signals is not always available to a single slice. For example, in one known FPGA, each CLE slice has an associated input multiplexer (IMUX) that can provide a maximum of ten input signals at any given time. Therefore, in some embodiments the size of the multiplexer that can be implemented in one programmable circuit, one slice, or one CLE is limited by the size of the input multiplexers.

Figure 11:
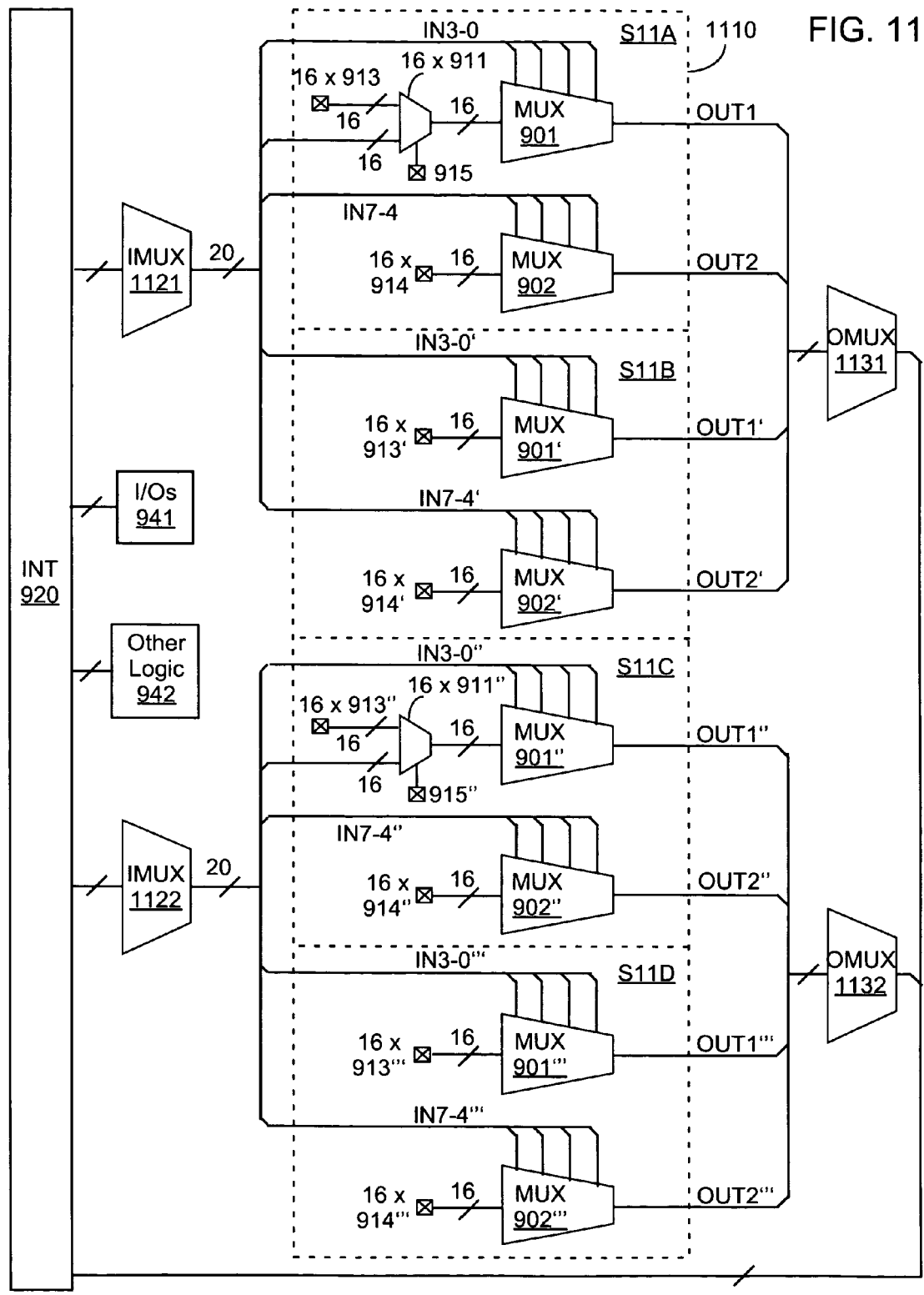
FIG. 11 illustrates a third exemplary fashion in which the programmable circuits of FIGS. 5–7 can be integrated into the fabric of an integrated circuit.

FIG. 11 shows an exemplary embodiment in which the maximum available number of input signals is increased by sharing an input multiplexer between adjacent slices. This embodiment is particularly useful for designs that include large numbers of 16-to-1 multiplexers. CLE 1110 of FIG. 11 includes four slices S11A–S11D. Slices S11A and S11C each include one programmable circuit similar to those utilized in CLE 910 of FIG. 9, and one known LUT (sixteen memory cells 914 and one multiplexer 902). The other two slices S11B and S11D each include two known LUTs. Thus, only one fourth of the available lookup table circuits include the LUT/MUX programmable circuit.

To increase the number of inputs available to the programmable circuit in slice S11A, slices S11A and S11B share a single input multiplexer 1121. Similarly, slices S11C and S11D share a single input multiplexer 1122. The total number of input signals for each pair of slices is twenty, twice the number of available signals in the known CLE of FIG. 2. When desired, all twenty of the input signals can be provided to the programmable circuit, to implement a 16-to-1 multiplexer. When the wide multiplexing function is not used, the input signals can be used as in a known LUT to implement other logic functions.

In the pictured embodiment, the paired slices also share output multiplexers 1131, 1132. However, the slices can continue to use separate output multiplexers, or can share yet smaller numbers of output multiplexers, if desired.

Figure 12:
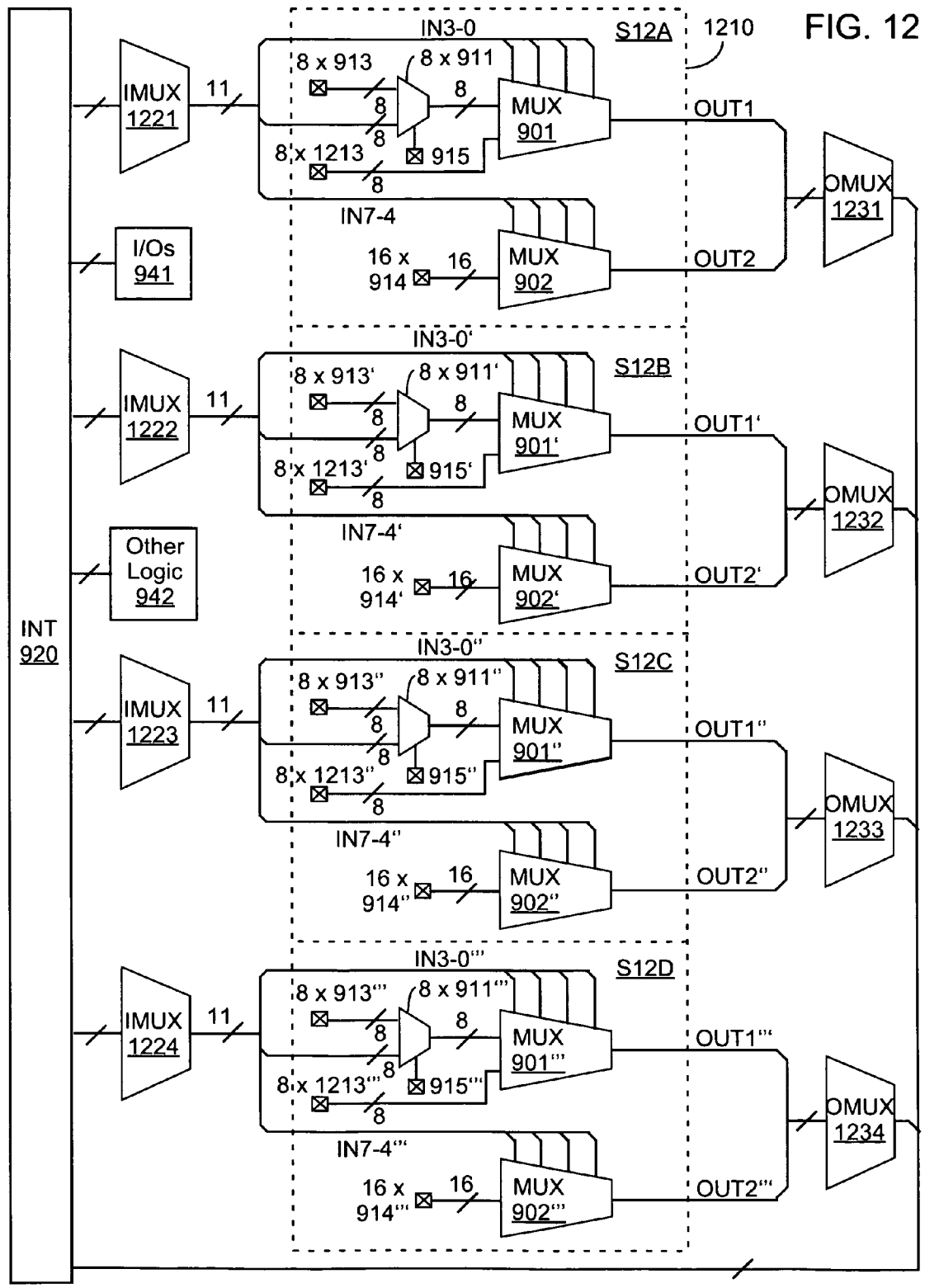
FIG. 12 illustrates a fourth exemplary fashion in which the programmable circuits of FIGS. 5–7 can be integrated into the fabric of an integrated circuit.
Figure 13:
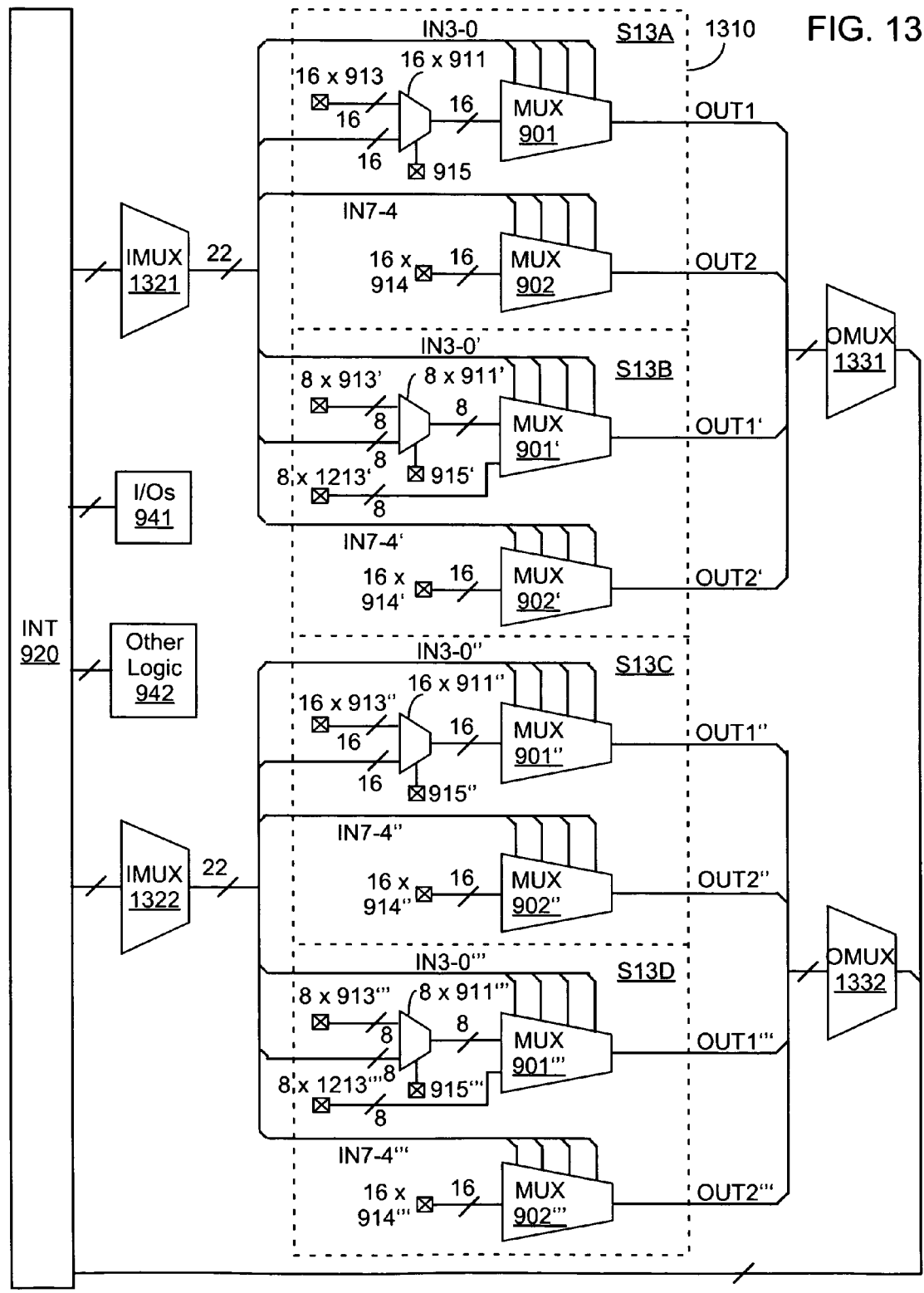
FIG. 13 illustrates a fifth exemplary fashion in which the programmable circuits of FIGS. 5–7 can be integrated into the fabric of an integrated circuit.

Note that the embodiments of FIGS. 11–13 do not include the F5, F6, F7, and F8 multiplexers shown in FIGS. 2, 9, and 10, as they are no longer needed. However, multiplexers F5, F6, F7, and F8 can still be included, if desired.

FIG. 12 shows an exemplary embodiment that is particularly useful for designs including large numbers of 8-to-1 multiplexers. CLE 1210 of FIG. 12 includes four slices S12A–S12D. Each slice includes one programmable circuit having function select multiplexers 911 on only eight of the sixteen inputs to the multiplexer 901. The other eight inputs are supplied directly from the associated memory cells 1213. For example, referring to FIG. 7, the programmable circuit can include memory cells MC-0 through MC-7 and function select multiplexers 510–517, or memory cells MC-8 through MC-15 and function select multiplexers 518–525, but does not include both sets of elements.

Each slice receives eleven input signals from associated input multiplexers 1221–1224. Thus, when the 8-to-1 multiplexer function is selected, 8 of the inputs are used for data inputs and three of the inputs provide select inputs to the multiplexer 901. When the wide multiplexing function is not used, the input signals can be used as in a known LUT to implement other logic functions.

In the pictured embodiment, each of the four slices S12A–S12D has an associated output multiplexer 1231–1234. However, the slices can share output multiplexers, if desired.

FIG. 13 shows an exemplary embodiment that is particularly useful for designs including both 16-to-1 and 8-to-1 multiplexers, or containing multiplexers of unknown size. CLE 1310 of FIG. 13 includes four slices S13A–S13D. Slices S13A and S13C are similar to the corresponding slices of CLE 1110 of FIG. 11. Slices S13B and S13D are similar to the corresponding slices of CLE 1210 of FIG. 12. In the pictured embodiment, the slices are paired to share input multiplexers 1321, 1322 and output multiplexers 1131, 1132 in a fashion similar to FIG. 11. However, other arrangements of the input and output multiplexers, and other numbers of input signals, can also be used.

Twenty-two input signals are provided to each pair of slices in CLE 1310, enabling the implementation of one 16-to-1 multiplexer or two 8-to-1 multiplexers in each pair of slices. Some embodiments (not shown) include dedicated multiplexers similar to the F5–F8 multiplexers shown in FIG. 2. For example, a 2-to-1 multiplexer driven by multiplexers 901 and 901" would permit the implementation of a 32-to-1 multiplexer in one CLE. The additional input signal could be accommodated by one of the two extra input signals in each slice not needed to implement the 16-to-1 multiplexers.

Clearly, the numbers of input, output, and other signals shown in FIGS. 11–13 are purely exemplary. Other numbers of input signals can be provided, although sufficient signals should be provided to enable the implementation of multiplexers of the desired sizes. Derivation of an appropriate number of input signals can easily be accomplished by those of skill in the art after examination of the present specification and figures.

Figure 14:
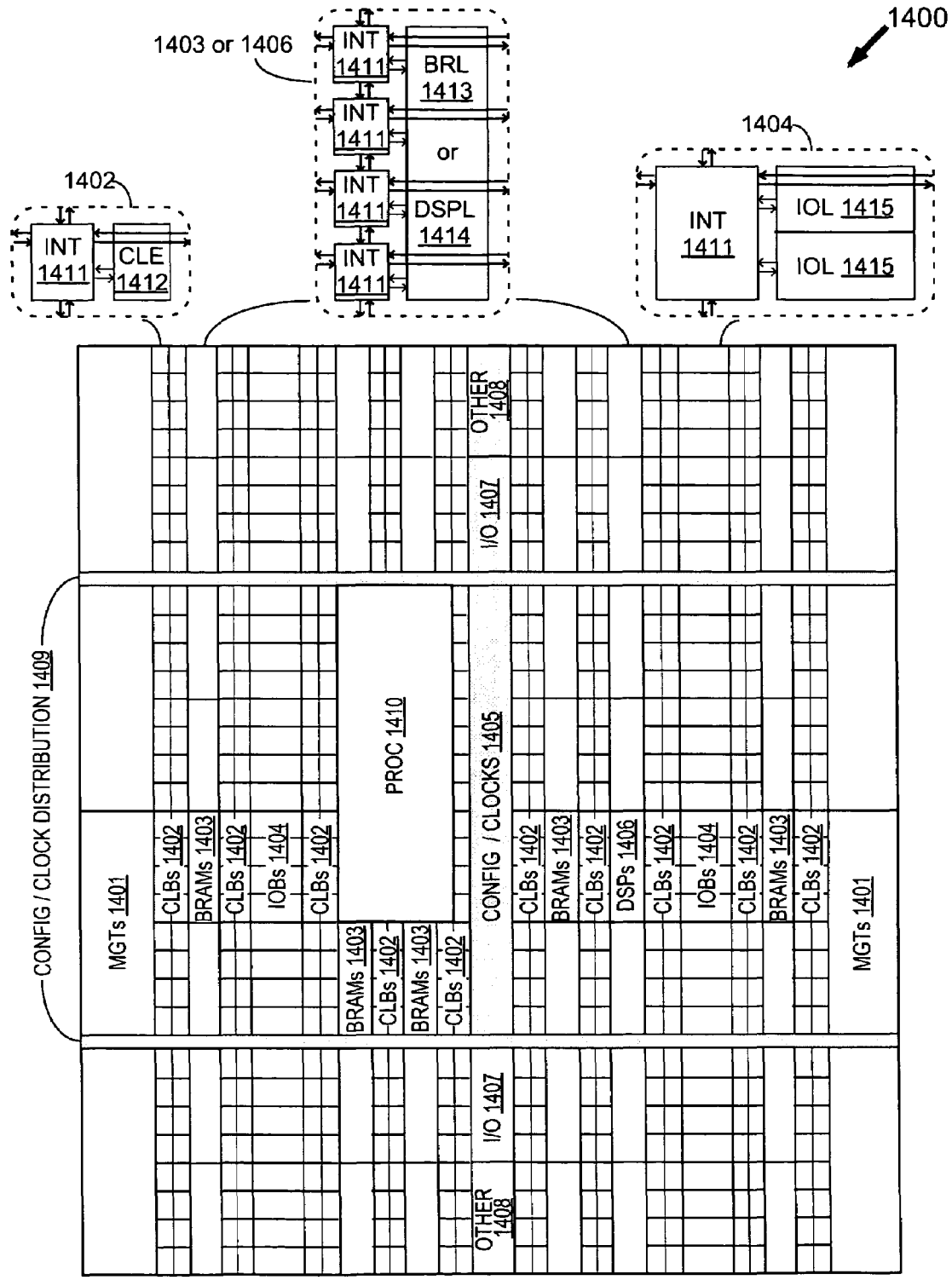
FIG. 14 illustrates in simplified form another FPGA architecture in which the programmable circuits described herein can be advantageously utilized.

FIG. 14 illustrates another type of PLD in which the programmable circuits described herein can optionally be included. The FPGA architecture 1400 of FIG. 14 includes a large number of different programmable tiles including multi-gigabit transceivers (MGTs 1401), configurable logic blocks (CLBs 1402), random access memory blocks (BRAMs 1403), input/output blocks (IOBs 1404), configuration and clocking logic (CONFIG/CLOCKS 1405), digital signal processing blocks (DSPs 1406), specialized input/output blocks (I/O 1407) (e.g., configuration ports and clock ports), and other programmable logic 1408 such as digital clock managers, analog-to-digital converters, system monitoring logic, and so forth. Some FPGAs also include dedicated processor blocks (PROC 1410).

In some FPGAs, each programmable tile includes a programmable interconnect element (INT 1411) having standardized connections to and from a corresponding interconnect element in each adjacent tile. Therefore, the programmable interconnect elements taken together implement the programmable interconnect structure for the illustrated FPGA. The programmable interconnect element (INT 1411) also includes the connections to and from the programmable logic element within the same tile, as shown by the examples included at the top of FIG. 14.

For example, a CLB 1402 can include a configurable logic element (CLE 1412) that can be programmed to implement user logic plus a single programmable interconnect element (INT 1411). A BRAM 1103 can include a BRAM logic element (BRL 1413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 1406 can include a DSP logic element (DSPL 1414) in addition to an appropriate number of programmable interconnect elements. An IOB 1404 can include, for example, two instances of an input/output logic element (IOL 1415) in addition to one instance of the programmable interconnect element (INT 1411). As will be clear to those of skill in the art, the actual I/O pads connected, for example, to the I/O logic element 1415 are manufactured using metal layered above the various illustrated logic blocks, and typically are not confined to the area of the input/output logic element 1415.

In the pictured embodiment, a columnar area near the center of the die (shown shaded in FIG. 14) is used for configuration, clock, and other control logic. Horizontal areas 1409 extending from this column are used to distribute the clocks and configuration signals across the breadth of the FPGA.

Some FPGAs utilizing the architecture illustrated in FIG. 14 include additional logic blocks that disrupt the regular columnar structure making up a large part of the FPGA. The additional logic blocks can be programmable blocks and/or dedicated logic. For example, the processor block PROC 1410 shown in FIG. 14 spans several columns of CLBs and BRAMs.

Note that FIG. 14 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 14 are purely exemplary. For example, in an actual FPGA more than one adjacent column of CLBs is typically included wherever the CLBs appear, to facilitate the efficient implementation of user logic.

Those having skill in the relevant arts of the invention will now perceive various modifications and additions that can be made as a result of the disclosure herein. For example, the above text describes the circuits of the invention in the context of programmable logic devices (PLDs) such as field programmable gate arrays (FPGAs). However, the programmable circuits described herein can also be implemented in other integrated circuits, such as in integrated circuits that are only partially programmable.

Further, multiplexers, memory cells, N-channel transistors, CMOS pass gates, inverters, buffers, inverting logic gates, interconnect structures, slices, CLEs, PLDs, FPGAs, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. An integrated circuit, comprising:
   an interconnect structure; and
   a plurality of programmable circuits coupled to the interconnect structure, each programmable circuit comprising:
   a function select memory cell;
   a plurality of first memory cells;
   a plurality of function select multiplexers each having a first data input terminal coupled to one of the first memory cells, a second data input terminal coupled to the interconnect structure, a select terminal coupled to the function select memory cell, and an output terminal;
   a first multiplexer having a plurality of data input terminals coupled to the output terminals of the function select multiplexers, a plurality of select terminals coupled to the interconnect structure, and an output terminal coupled to the interconnect structure; and
   an input multiplexer coupled between the interconnect structure and the second data input terminals of the function select multiplexers.

2. The integrated circuit of claim 1, wherein for each programmable circuit the input multiplexer is further coupled between the interconnect structure and the select terminals of the first multiplexer.

3. The integrated circuit of claim 1, further comprising, for each programmable circuit, an output multiplexer coupled between the output terminal of the first multiplexer and the interconnect structure.

4. The integrated circuit of claim 1, wherein for each programmable circuit the plurality of first memory cells comprises 16 memory cells and the plurality of function select multiplexers comprises 16 multiplexers.

5. The integrated circuit of claim 1, wherein for each programmable circuit the plurality of first memory cells comprises 64 memory cells and the plurality of function select multiplexers comprises 64 multiplexers.

6. The integrated circuit of claim 1, wherein the integrated circuit comprises a programmable logic device (PLD).

7. The integrated circuit of claim 6, wherein the PLD comprises an FPGA, and the plurality of first memory cells and the function select memory cell comprise configuration memory cells of the FPGA.

8. The integrated circuit of claim 1, wherein each programmable circuit further comprises a plurality of inverting logic gates, and wherein for each programmable circuit the first multiplexer comprises a plurality of CMOS pass gates coupled between the data input terminals and the output terminal of the first multiplexer, the CMOS pass gates having first gate terminals coupled to the interconnect structure and second gate terminals coupled to the interconnect structure via the inverting logic gates.

9. The integrated circuit of claim 1, wherein for each programmable circuit the first multiplexer comprises a plurality of N-channel transistors coupled between the data input terminals and the output terminal of the first multiplexer, the N-channel transistors having gate terminals coupled to the interconnect structure.

10. The integrated circuit of claim 1, further comprising, for each pair of the programmable circuits, a second multiplexer having a first data input terminal coupled to an output terminal of a first programmable circuit in the pair, a second data input terminal coupled to an output terminal of a second programmable circuit in the pair, a select terminal coupled to the interconnect structure, and an output terminal coupled to the interconnect structure.

11. The integrated circuit of claim 10, further comprising, for each pair of the second multiplexers, a third multiplexer having a first data input terminal coupled to the output terminal of one of the second multiplexers in the pair, a second data input terminal coupled to the output terminal of the other second multiplexer in the pair, a select terminal coupled to the interconnect structure, and an output terminal coupled to the interconnect structure.

12. The integrated circuit of claim 1, wherein, for at least some of the programmable circuits, the first multiplexer comprises a second plurality of data input terminals coupled directly to corresponding ones of the first memory cells.

13. An integrated circuit, comprising:
an interconnect structure;
a plurality of first memory cells;
a function select memory cell;
a plurality of function select multiplexers each having a first data input terminal coupled to one of the first memory cells, a second data input terminal coupled to the interconnect structure, a select terminal coupled to the function select memory cell, and an output terminal;
a first multiplexer having a plurality of data input terminals coupled to the output terminals of the function select multiplexers, a plurality of select terminals coupled to the interconnect structure, and an output terminal coupled to the interconnect structure; and
an input multiplexer coupled between the interconnect structure and the second data input terminals of the function select multiplexers.

14. The integrated circuit of claim 13, wherein the input multiplexer is further coupled between the interconnect structure and the select terminals of the first multiplexer.

15. The integrated circuit of claim 13, further comprising an output multiplexer coupled between the output terminal of the first multiplexer and the interconnect structure.

16. The integrated circuit of claim 13, wherein the plurality of first memory cells comprises 16 memory cells and the plurality of function select multiplexers comprises 16 multiplexers.

17. The integrated circuit of claim 13, wherein the plurality of first memory cells comprises 64 memory cells and the plurality of function select multiplexers comprises 64 multiplexers.

18. The integrated circuit of claim 13, wherein the integrated circuit comprises a programmable logic device (PLD).

19. The integrated circuit of claim 18, wherein the PLD comprises an FPGA, and the plurality of first memory cells and the function select memory cell comprise configuration memory cells of the FPGA.

20. The integrated circuit of claim 13, further comprising a plurality of inverting logic gates, and wherein the first multiplexer comprises a plurality of CMOS pass gates coupled between the data input terminals and the output terminal of the first multiplexer, the CMOS pass gates having first gate terminals coupled to the interconnect structure and second gate terminals coupled to the interconnect structure via the inverting logic gates.

21. The integrated circuit of claim 13, wherein the first multiplexer comprises a plurality of N-channel transistors coupled between the data input terminals and the output terminal of the first multiplexer, the N-channel transistors having gate terminals coupled to the interconnect structure.

22. The integrated circuit of claim 13, wherein the first multiplexer comprises a second plurality of data input terminals coupled directly to corresponding ones of the first memory cells.

* * * * *